(12) United States Patent
Chen

(10) Patent No.: US 7,504,319 B2
(45) Date of Patent: Mar. 17, 2009

(54) APPARATUS AND METHOD OF WAFER DICING

(75) Inventor: Chien-Yu Chen, Fongshan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 120 days.

(21) Appl. No.: 11/320,653

(22) Filed: Dec. 30, 2005

(65) Prior Publication Data

US 2006/0292829 A1 Dec. 28, 2006

(30) Foreign Application Priority Data

Jun. 23, 2005 (TW) .............................. 94121048 A

(51) Int. Cl.
*H01L 21/00* (2006.01)
(52) U.S. Cl. ................. 438/464; 257/E21.599
(58) Field of Classification Search ................. 438/464; 257/E21.599
See application file for complete search history.

(56) References Cited

U.S. PATENT DOCUMENTS

| | | | | |
|---|---|---|---|---|
| 3,040,489 A * | 6/1962 | Da Costa | ................ | 53/435 |
| 3,601,296 A * | 8/1971 | Pick et al. | ................ | 225/103 |
| 3,615,047 A * | 10/1971 | Feldman et al. | ................ | 225/1 |
| 3,743,148 A * | 7/1973 | Carlson | ................ | 225/2 |
| 3,870,196 A * | 3/1975 | Hargraves | ................ | 225/1 |
| 5,238,876 A * | 8/1993 | Takeuchi et al. | ................ | 438/464 |
| 6,849,523 B2 * | 2/2005 | Chao et al. | ................ | 438/460 |
| 2004/0166654 A1* | 8/2004 | Matsuda et al. | ................ | 438/460 |
| 2004/0180514 A1* | 9/2004 | Chao et al. | ................ | 438/460 |
| 2005/0282359 A1* | 12/2005 | Nagai et al. | ................ | 438/459 |

* cited by examiner

*Primary Examiner*—Lex Malsawma
(74) *Attorney, Agent, or Firm*—Bacon & Thomas, PLLC

(57) ABSTRACT

A wafer dicing method includes the following steps. First, the wafer is adhered on an adhesive material. Next, the adhesive material is disposed on a frame. Then, the frame is clamped by a fixture, for fixing the wafer. Afterwards, a roller rotates against the adhesive material, for applying a force on several cutting lines of the wafer to separate the wafer into dice.

8 Claims, 5 Drawing Sheets

APPARATUS AND METHOD OF WAFER DICING

This application claims the benefit of Taiwan application Serial No. 94121048, filed Jun. 23, 2005, the subject matter of which is incorporated herein by reference.

BACKGROUND OF THE INVENTION

1. Field of the Invention

The invention relates in general to an apparatus and a method of wafer dicing and more particularly to an apparatus and a method having a roller for separating dies.

2. Description of the Related Art

Referring to FIG. 1, a schematic view of a double-layered wafer is shown. The double-layered wafer 100 is assembled by a silicon substrate and a glass substrate. The backside 102a of the silicon substrate 102 and the upper surface 104a of the glass substrate 104 separately have several first cutting lines 112 and the second cutting lines 114. The conventional separating method of the double-layered wafer 100 is to apply a force by an operator on the first cutting line 112 of the silicon substrate 102 and the second cutting line 114 of the glass substrate 104 to break the double-layered wafer and to separate it into several double-layered dies. The strength and the direction of the force applied by the operator is hard to control; therefore the edge of the separated double-layered wafer appears to be uneven and that affects the electrical characteristic of the dies applied on components. If the area having pads on the double-layered wafer is damaged during the conventional separating process, then the damaged dies will be discarded for the dies not operating normally. The yield rate of separated double-layered dies is only 60%~70% according to said conventional method, and the qualities of the separated dies remains unstable. Therefore it is an important issue that how to separate the wafers into dies completely and effectively.

SUMMARY OF THE INVENTION

It is therefore an object of the invention to provide an apparatus and a method of wafer dicing. A fixer fixes a wafer and then a force is uniformly applied on several cutting marks of the wafer via the roller for the wafer being separated into several dies. Consequently, the edges of separated dies are even, and the yield rate of successfully separated dies is raised too.

The invention achieves the above-identified object by providing a wafer dicing method. Firstly, a wafer is adhered on an adhesive material. Next, the adhesive material is disposed on a frame. Then, for fixing the wafer, the frame is clamped by a fixer. Afterwards, a roller rotates against the adhesive material for applying a force on several cutting lines of the wafer to separate the wafer into dice.

The invention achieves the above-identified object by further providing a double-layered wafer dicing method. First, a double-layered wafer including a first wafer and a second wafer disposed on the first wafer is provided. Next, the first wafer is adhered on the adhesive material. Then, the adhesive material is disposed on the frame. Afterwards, for fixing the double-layered wafer, the frame is clamped by a fixer. Moreover, a roller is rolled on the adhesive material for applying a force on several first cutting lines of the first wafer for separating the first wafer into several first dies. Then, the double-layered wafer and the adhesive material are separated. Afterwards, the second wafer is adhered on the adhesive material. Next, a roller is rolled on the adhesive material for applying a force on several second cutting lines of the second wafer for the second wafer separating into several second dies.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, the wafer is adhered on the adhesive material, the adhesive material is then disposed on the frame, and a clamp is used to clamp the frame for fixing the wafer. Afterwards, a roller is rolled on the adhesive material to apply a force on the cutting lines of the wafer and the wafer is separated into several dies. Because the roller applies a force uniformly on the wafer and the direction of the applied force is easily to be controlled, the edges of separated dies appears to be even and the yield rate of the dies is raised too.

Figure 2A:
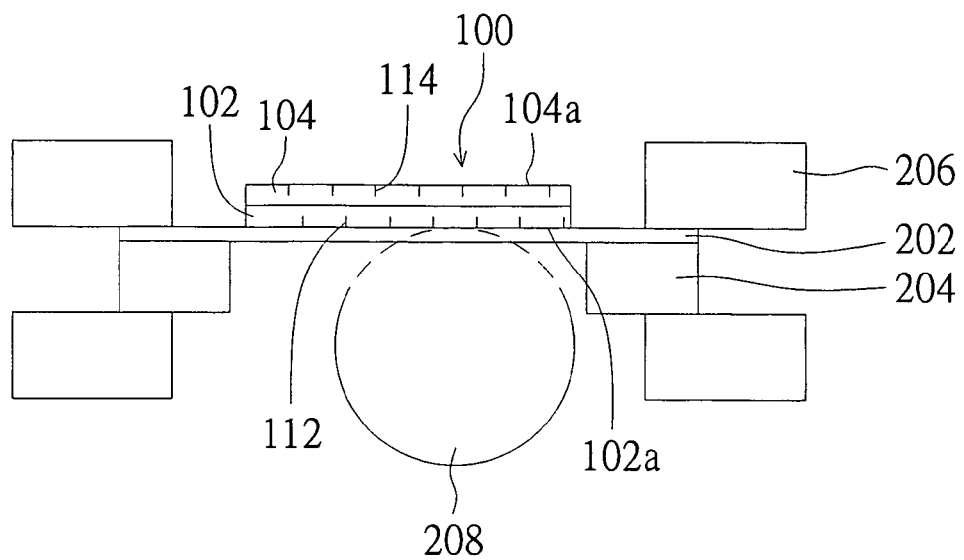
FIG. 2A is a side view of the wafer dicing apparatus according to the preferred embodiment of the present invention.
Figure 2B:
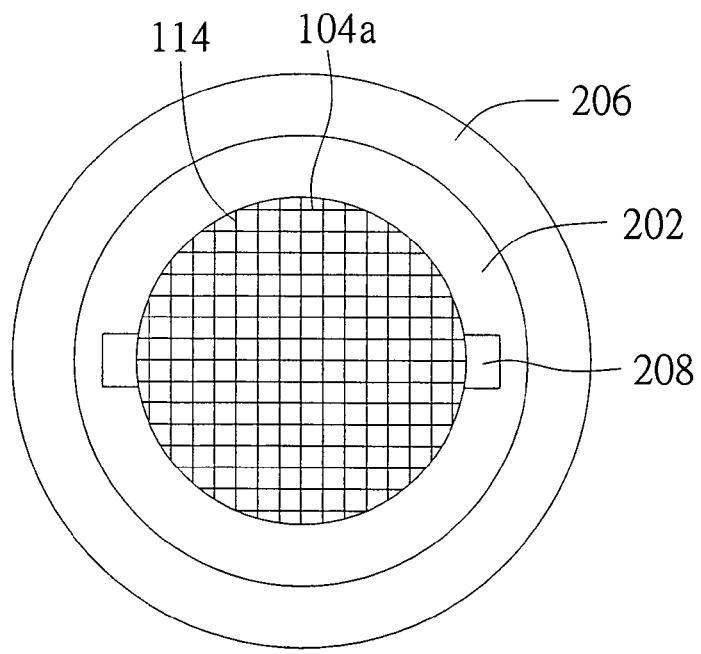
FIG. 2B is a top view of the wafer dicing apparatus in FIG. 2A.

Referring to FIG. 2A and FIG. 2B, FIG. 2A is a side view of the wafer dicing apparatus according to the preferred embodiment of the present invention. FIG. 2B is a top view of wafer dicing apparatus in FIG. 2A. The wafer dicing apparatus according to this embodiment includes a fixer and a separator. The fixer for fixing the wafer 100 is adhered on the adhesive material. The adhesive material 202, such as a tape, preferably is an UV tape. The fixer includes a frame 204 and a clamp 206. The frame 204 is used to receive the adhesive material 202 and the clamp 206 is used to clamp the frame 204 for fixing the wafer 100. The wafer dicing apparatus having a roller 208 is rotatably disposed in the frame 204 and under the adhesive material 202. The diameter of the roller 208 is preferably smaller than the internal diameter of the frame 204.

Figure 3:
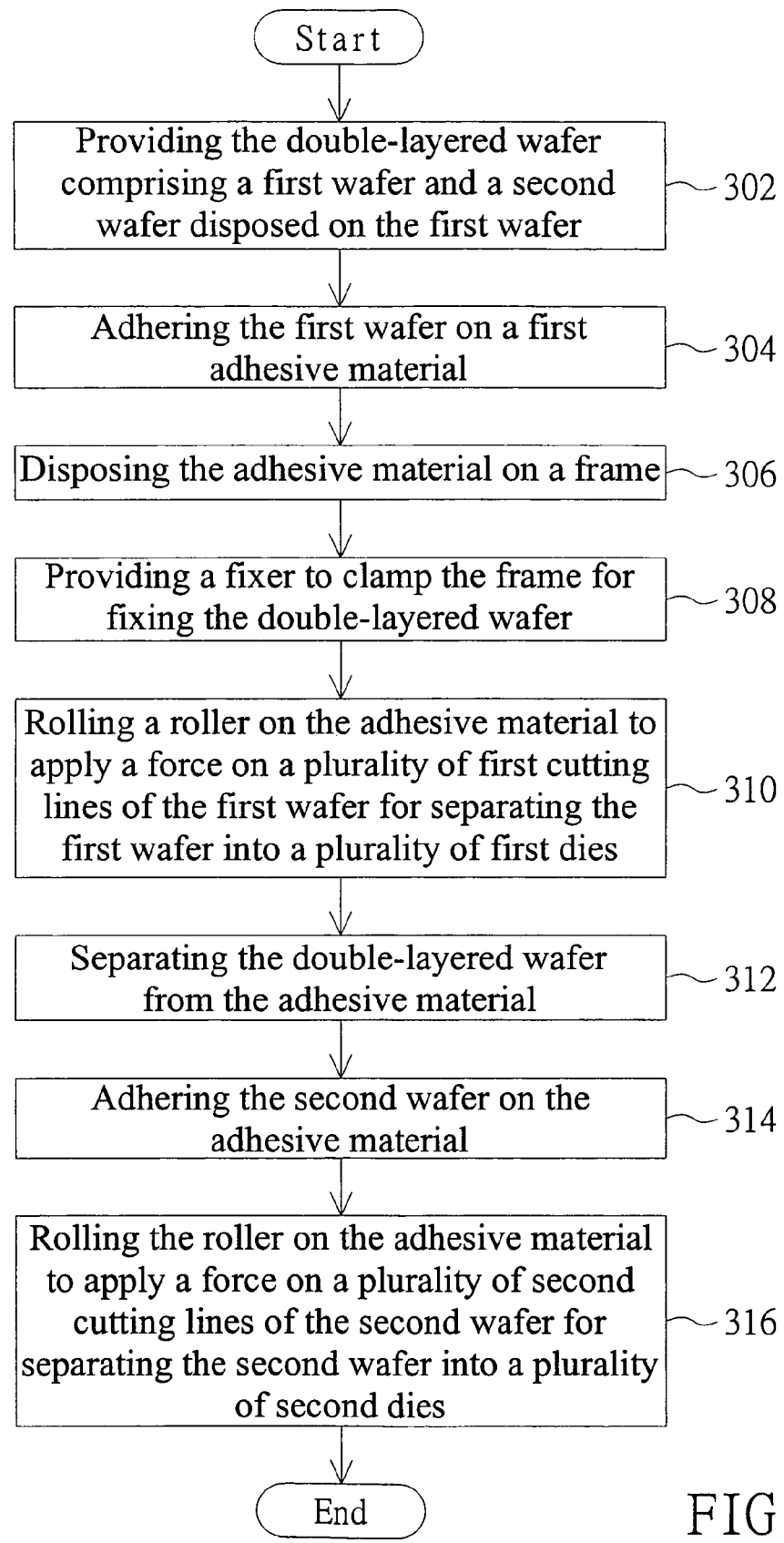
FIG. 3 is a flowchart of a wafer dicing method according to the preferred embodiment of the present invention.

Referring to the FIG. 3 and the FIGS. 4A~4E, the FIG. 3 is a flowchart of a wafer dicing method according to preferred embodiment of the present invention, and FIGS. 4A~4E are schematic views showing the wafer dicing method in FIG. 3. An example of apply the dicing method according to the embodiment to the double-layered wafer is used for illustration and it will be appreciated by a person having ordinary skills in the art that the present invention is not limited thereto.

Figure 1:
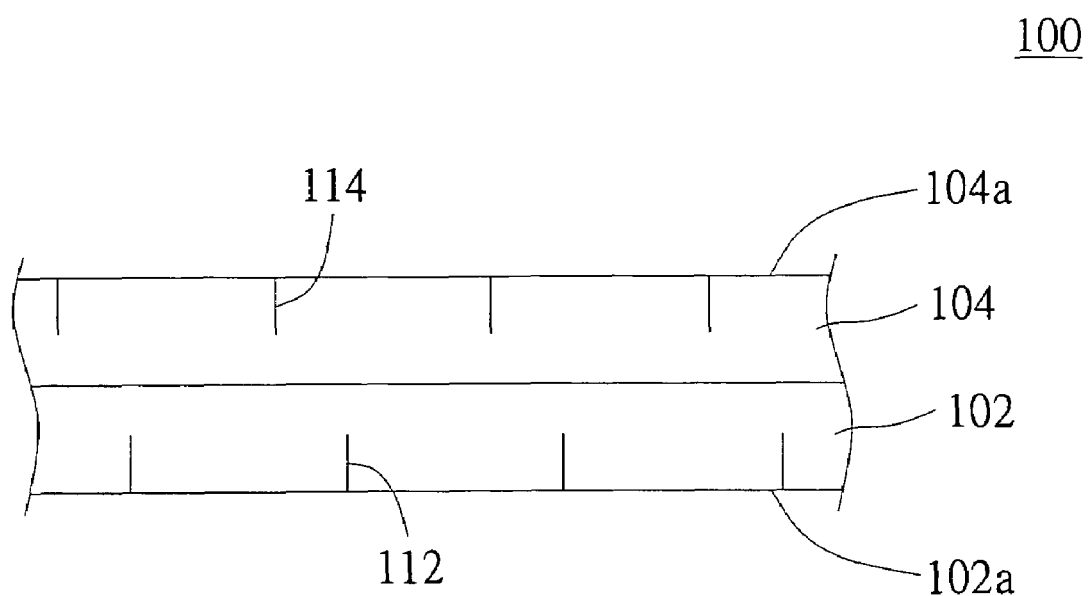
FIG. 1 (Prior Art) is a schematic view of a double-layered wafer.

The wafer dicing method according to this preferred embodiment includes steps 302~316. First, as shown in step 302 and FIG. 1, the double-layered wafer 100 including the first wafer 102 and the second wafer 104 is provided. The first wafer 102 has several first cutting lines 112 to be cut off and the second wafer 104 has second cutting lines to be cut off. The second wafer 104 is disposed on the first wafer 102. The first cutting lines 112 and the second cutting lines 114 are staggered. The first wafer 102 and the second wafer 104, for example, respectively are a silicon substrate and a glass substrate.

Figure 4A:
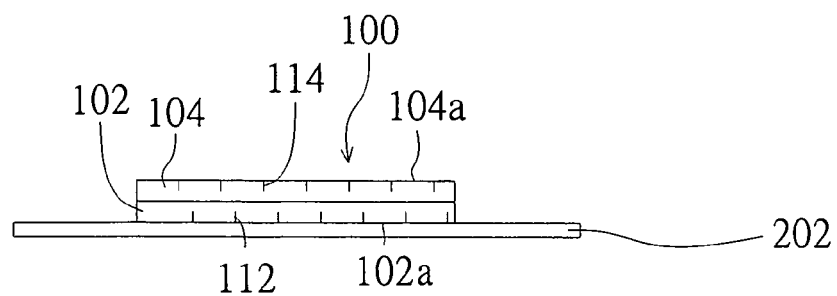
FIGS. 4A~4E are schematic views showing the wafer dicing method in FIG. 3.
Figure 4B:
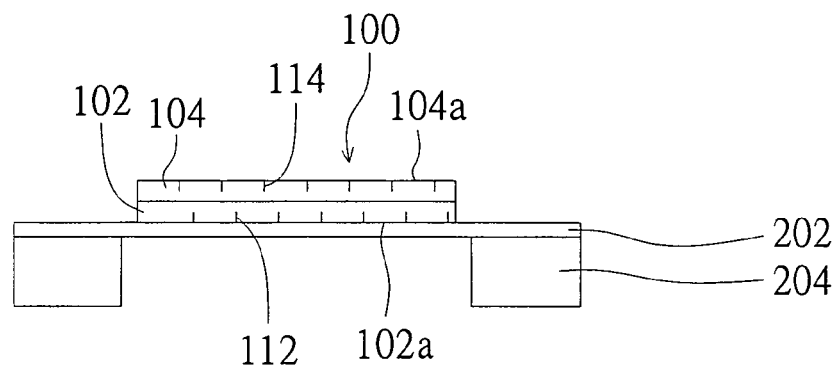
Figure 4C:
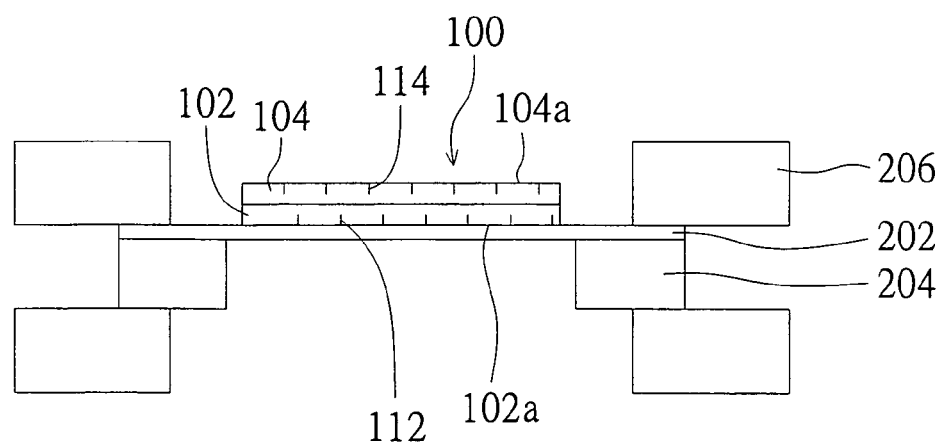
Figure 4D:
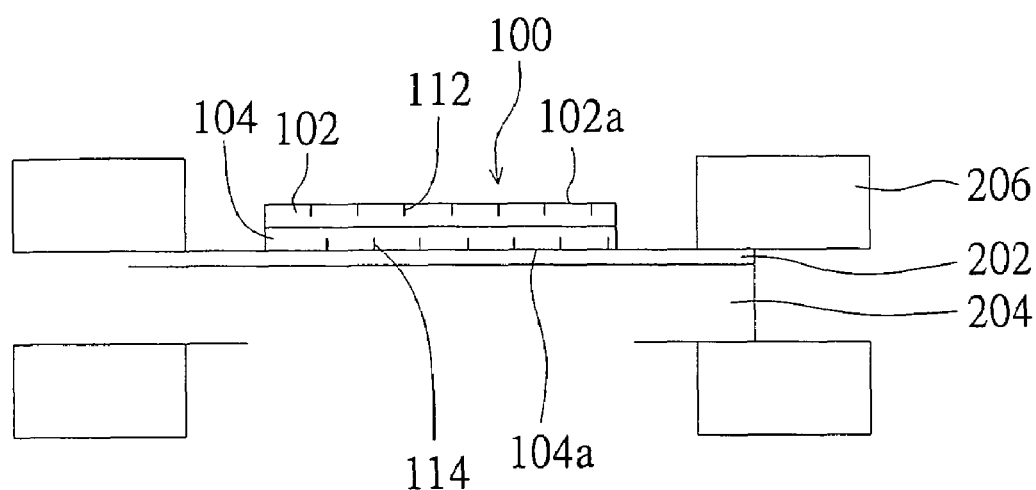
Figure 4E:
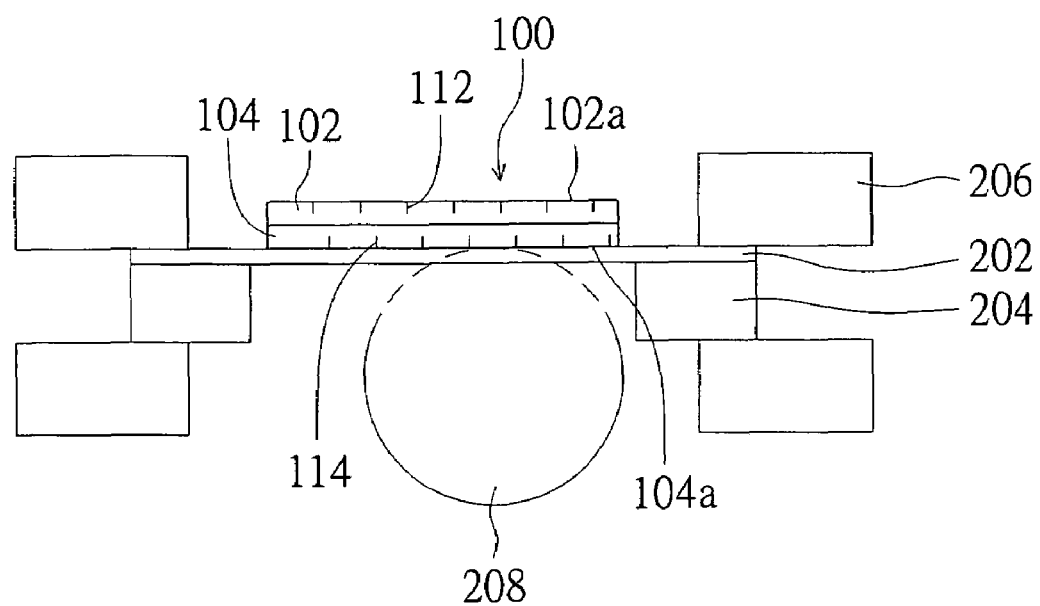

Afterwards, as shown in step 304 and FIG. 4A, the first wafer 102 is adhered on the adhesive material 202. As shown in step 306 and FIG. 4B, the adhesive material 202 is then disposed on the frame 204. Then, as shown in step 308 and FIG. 4C, the clamp 206 is used to clamp the frame 204 for fixing the double-layered wafer 100. The clamp 206 clamps the frame 204 and the adhesive material 202 as a whole, as shown in FIG. 4C. If the area of the adhesive material 202 is substantially smaller than the area of the frame 204, the clamp 206 could clamp the frame 204 only but not clamp the adhesive material 202.

Moreover, as shown in step 310 and FIG. 2A, the roller 208 is rolled on the adhesive material to apply a force on the first cutting lines 112 of the first wafer 102 for separating the first wafer 102 into several first dies. The roller 208, for example, applies an upward force on the first cutting line 112 of the first wafer. Preferably, the roller 208 is electrically connected with an automatic apparatus so that the rolling speed of roller 208 can be controlled by the automatic apparatus. The rolling speed of the roller 208 could be set as a fixed value for uniformly applying a force on the wafer and separating the wafer into several dies.

Afterwards, as shown in step 312, the double-layered wafer 100 and the material adhesive 202 are separated. And next as shown in step 314 and FIG. 4D, the second wafer 104 is adhered on the adhesive material 202. Then as shown in step 316 and FIG. 4E, the roller 208 rotates on the adhesive material 202 to apply a force on several second cutting lines 114 of the second wafer 104 for separating the second wafer 104 into several second dies.

The dicing method and apparatus applied to the double-layered wafer is used as an example for illustration in the present invention. However, it is to be appreciated by a person having ordinary skills in the art. The present invention is not limited to be applied to a double-layered wafer, but also could be applied to a single-layered wafer. When the apparatus and the method of wafer dicing according to the invention are applied to a single-layered wafer, said steps 312~316 could be omitted. Namely, the surface of a single-layered wafer having cutting lines only has to be adhered on the adhesive material and then the adhesive material are disposed on the frame clamped by the clamp for fixing the wafer. Then, the roller rotates to apply a force on the surface of cutting lines to separate the single-layered wafer into several single-layered dies.

The apparatus and the method of wafer dicing according to the present embodiment use the clamp to fix the wafer and then use the roller to uniformly apply a force on several cutting marks of the wafer so that the wafer is separated into several dies whose edges are even. Automation can be achieved if the roller is electrically connected to and controlled by the automatic device. Therefore, the yield rate of dies is raised and the quality of the dies is stable according to this invention, thereby reducing damages of dies and solving the problems conventionally caused by the manual operation.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A double-layered wafer dicing method, comprising:
providing the double-layered wafer comprising a first wafer and a second wafer disposed on the first wafer;
adhering the first wafer on a first adhesive material;
disposing the adhesive material on a frame
providing a clamp to clamp the frame for fixing the double-layered wafer;
rolling a roller on the adhesive material to apply a force on a plurality of first cutting lines of the first wafer for separating the first wafer into a plurality of first dies;
separating the double-layered wafer from the adhesive material;
adhering the second wafer on the adhesive material; and rolling the roller on the adhesive material to apply a force on a plurality of second cutting lines of the second wafer for separating the second wafer into a plurality of second dies.

2. The method according to claim 1, wherein a diameter of the roller is smaller than an internal diameter of the frame.

3. The method according to claim 1, wherein the roller is rotatably disposed in the frame and is under the adhesive material.

4. The method according to claim 1, wherein the adhesive is a tape.

5. The method according to claim 4, wherein the tape is a UV tape.

6. The method according to claim 1, wherein the first cuffing lines and the second cuffing lines are staggered.

7. The method according to claim 1, wherein the first wafer is a silicon substrate and the second wafer is a glass substrate.

8. The method according to claim 1, wherein the roller is electrically connected with an automatic apparatus and a rolling speed of the roller is controlled by the automatic apparatus.

* * * * *